United States Patent [19]
Guo et al.

[11] Patent Number: 5,825,093
[45] Date of Patent: Oct. 20, 1998

[54] ATTACHMENT SYSTEM AND METHOD THEREFOR

[75] Inventors: Yifan Guo, Gilbert; Rao Bonda, Chandler; Geoff Swan, Phoenix, all of Ariz.

[73] Assignee: Motorola, Inc., Schaumburg, Ill.

[21] Appl. No.: 829,397

[22] Filed: Mar. 31, 1997

[51] Int. Cl.$^6$ ............................ H01L 23/48; H01L 23/52; H01L 29/40

[52] U.S. Cl. .......................... 257/782; 257/781; 257/783; 438/612

[58] Field of Search .................................... 257/779, 780, 257/786, 781, 782, 783, 642; 438/612, 118, 654, 778, 780

[56] References Cited

U.S. PATENT DOCUMENTS 5,220,200  6/1993  Blanton .
5,289,631  3/1994  Koopman et al. .
5,376,584  12/1994  Agarwala .

OTHER PUBLICATIONS

"Physical Design and Assembly Process Development of a Multi–chip Package Containing a Light Emitting Diode (LED) Array Die" by Rao Bonda, Treliant Fang, Ken Kaskoun, Bill Lytle, Geoff Swan, John W. Stafford; 1996 Electronic components & Technology Conference; Chapter 19, pp. 1039–1046.

*Primary Examiner*—Mahshid D. Saadat
*Assistant Examiner*—S. V. Clark
*Attorney, Agent, or Firm*—Robert F. Hightower

[57] ABSTRACT

An attachment system (10,30) for electronic devices utilizes an interconnect substrate (11) and an attachment area (12,32) formed thereon. A non-wettable material (16,36) on a surface (13) of the substrate (11) substantially prevents an attachment material (17) from forming stress or cracks in the substrate (11).

9 Claims, 1 Drawing Sheet

ATTACHMENT SYSTEM AND METHOD THEREFOR

BACKGROUND OF THE INVENTION

The present invention relates, in general, to electronic device attachment systems and methods, and more particularly, to a novel system and method for attaching electronic components.

In the past, a variety of techniques have been used to attach electronic components to an interconnect substrate. One particular attachment system, often referred to as Chip On Glass, utilizes a flip-chip process to attach semiconductor die to a glass interconnect substrate. Typically, a metallic conductor is applied to the glass substrate, and a solder ball is applied to the semiconductor device. The solder ball is used to attach the semiconductor device to the metallic conductor. One problem with this attachment technique is cracking or fracturing of the glass substrate under and around the metal conductor. These cracks or fractures often result in faulty attachment or faulty interconnect thereby reducing the reliability and increasing the cost of the electronic devices.

Accordingly, it is desirable to have an interconnect technique that does not cause substrate cracks or fractures, and that has a high reliability.

DETAILED DESCRIPTION OF THE DRAWINGS

Figure 1:
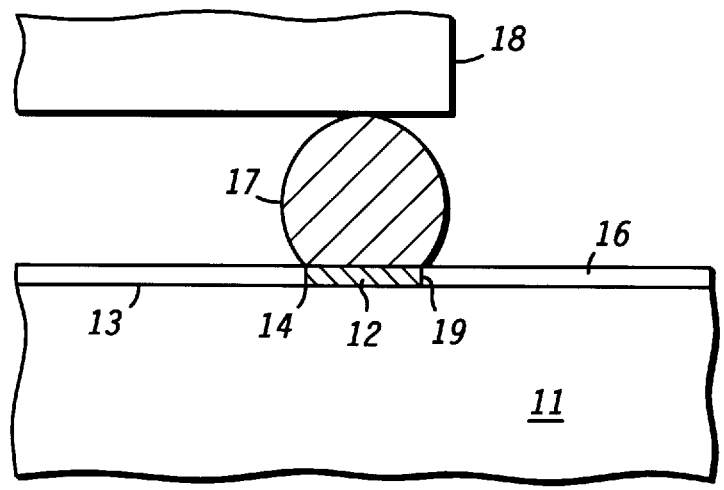
FIG. 1 illustrates a cross-sectional portion of an embodiment of an attachment system according to the present invention.

FIG. 1 illustrates an enlarged cross-sectional portion of an embodiment of an attachment system 10 that provides a highly reliable attachment. System 10 includes an interconnect substrate 11 that has a surface 13. Substrate 11 generally is attached to an electronic device 18, for example a semiconductor die. Substrate 11 typically is a low fracture strength material and correspondingly has a fracture toughness no greater than approximately five kilograms per millimeter to the 3/2 power (5.0 Kg/(mm)$^{3/2}$). Some suitable materials for substrate 11 include glass, gallium arsenide (GaAs), silicon, and aluminum nitride. An attachment area 12 is applied to surface 13 in order to facilitate attaching device 18 to substrate 11. Attachment area 12 may be a variety of attachment materials that are well known to those skilled in the art including a single metal layer or a multilayer stack of various metals, for example a multilayer material of chrome, copper, nickel, and gold. Attachment area 12 has a bottom surface in contact with substrate 11, a top surface that will be used to facilitate attaching electronic devices, sides 19, and an outer periphery or boundary 14 along the interface of surface 13 with the corner formed at the junction of sides 19 and the bottom of area 12.

An attachment material 17 is applied to device 18 and is used to attach device 18 to substrate 11. Typically, device 18 is positioned so that material 17 is on attachment area 12. Material 17 can be any of a variety of attachment materials that are well known to those skilled in the art including a gold bump, eutectic solder (tin/lead 63/37), and other solder combinations such as tin/lead 10/90. Heat is applied to form the attachment. The heat causes material 17 to become soft and wet to attachment area 12. Material 17 can also be formed of conductive epoxy, in which case heat is not applied.

A non-wettable material 16 is applied on surface 13 of substrate 11. Non-wettable material 16 is formed from a material that attachment material 17 cannot wet to in order to prevent forming force vectors along surface 13 as will be seen hereinafter. Non-wettable material 16 is applied to at least abut outer periphery or boundary 14. This configuration allows non-wettable material 16 to prevent the material of attachment material 17 from touching surface 13 thereby increasing the reliability of system 10. Typically, material 16 also abuts outside edges 19 of area 12 and may even overlap onto the top surface of area 12. Suitable for materials for non-wettable material 16 include polyimide, titanium, and chromium in addition to aluminum having an aluminum oxide layer on the surface thereof.

Material 17 and substrate 11 generally have different coefficients of thermal expansion (CTE). CTE's of typical materials for substrate 11 generally are less then six parts per million per degree Celsius (ppm/°C.), for example glass is about two to three ppm/°C. and GaAs is about six ppm/°C. Typical CTE's of material for attachment material 17 generally range from ten to thirty ppm/°C. and some examples include eutectic solder about twenty four ppm/°C., and 10/90 solder about twenty eight ppm/°C. If material 17 wets to outer boundary 14, this mismatch in CTE or difference between the value of the CTE of material 17 and the value of the CTE of substrate 11 creates force vectors on surface 13 along boundary 14. The force vectors can result in stresses or cracks in substrate 11. It has been found that using two materials having a difference or mismatch in CTE values of ten ppm/°C. or higher results in applying sufficient force vectors to cause cracks or fractures in substrate 11. By forming non-wettable material 16 abutting boundary 14, attachment material 17 is prevented from contacting surface 13 and boundary 14 thereby substantially eliminating the force vectors along with the stresses and cracks.

Figure 2:
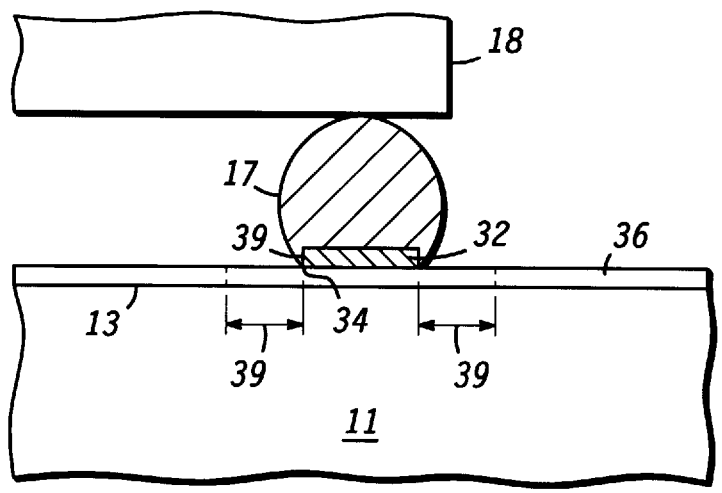
FIG. 2 illustrates a cross-sectional portion of an alternate embodiment of the attachment system of FIG. 1 according to the present invention.

FIG. 2 illustrates an enlarged cross-sectional portion of an attachment system 30 that is an alternate embodiment of system 10 shown in FIG. 1. The same reference numbers are used to represent the same elements in FIGS. 1 and 2. System 30 has a non-wettable material 36 applied to surface 13. Material 36 is the same as material 16 discussed in FIG. 1. An attachment area 32 is formed on the surface of material 36 and has an outer boundary 34. Area 32 is the same as area 12 of FIG. 1. However, area 32 is formed on material 36 instead of on surface 13. Outer boundary 34 of area 32 is the same as outer boundary 14 of area 12 except outer boundary 34 has an interface to material 36 instead of surface 13. However, material 36 still abuts boundary 34. Alternately, area 32 can be applied to material 36 and then material 36 applied to surface 13, for example an adhesive can be used to attach material 36. In addition, material 36 can be formed to extend only a distance 39 from area 32 and not cover all of surface 13. Distance 39 is sufficient to ensure that material 17 does not contact surface 13. For the purpose of illustration, the end of material 36 in such a case is shown in phantom.

In this configuration, material 17 wets to the top surface of area 32 and to sides 39 of area 32. However, material 36 prevents material 17 from touching surface 13 thereby preventing the formation of force vectors on substrate 11 along boundary 34.

By now it should be appreciated that there has been provided a novel attachment system and method for improving the reliability of attaching electrical components to a low fracture toughness interconnect substrate. Abutting a non-wettable material to an outer boundary of the attachment area substantially eliminates forming force vectors along the surface of the substrate thereby substantially eliminating stress and cracks in the substrate. The improved reliability allows the attachment system to be used in modules containing many devices, such as hybrid power modules for cellular telephones and driver chips on glass substrates.

We claim:

1. An attachment method comprising:

providing a substrate having a surface and an attachment area on the surface of the substrate; and forming a non-wettable material on the surface of the substrate and abutting the attachment area wherein the non-wettable material prevents an attachment material from contacting the surface and wherein the non-wettable material does not underlie the attachment area.

2. An attachment method comprising:

providing a substrate having a surface and an attachment area; and forming a non-wettable material on the surface of the substrate and abutting the attachment area wherein the non-wettable material prevents an attachment material from contacting the surface by applying the non-wettable material to the surface of the substrate after the attachment area is applied to the non wettable material.

3. An attachment method comprising:

providing a substrate having a surface and an attachment area; and forming a non-wettable material on the surface of the substrate and abutting the attachment area wherein the non-wettable material prevents an attachment material from contacting the surface and wherein the substrate and the attachment material have a difference in coefficients of thermal expansion of at least ten ppm/°C.

4. An attachment method comprising:

providing a substrate having a surface and an attachment area; and wherein the substrate has a fracture toughness no greater than 5.0 Kg/(mm)$^{3/2}$; and forming a non-wettable material on the surface of the substrate and abutting the attachment area wherein the non-wettable material prevents an attachment material from contacting the surface.

5. An attachment system comprising:

a substrate having a first coefficient of thermal expansion;

an attachment area on the substrate, the attachment area having a first surface, a second surface, and an outer boundary around a periphery of the second surface;

an attachment material on the first surface of the attachment area, the attachment material having a second coefficient of thermal expansion wherein a difference between a value of the first coefficient of thermal expansion and a value of the second coefficient of thermal expansion is at least ten ppm/°C.; and a non-wettable material abutting the outer boundary of the attachment area.

6. The attachment system of claim 1 wherein the non-wettable material extends from the substrate up along a side of the attachment area.

7. The attachment system of claim 5 wherein the first coefficient of thermal expansion is less than six ppm/°C.

8. The attachment system of claim 5 wherein the second coefficient of thermal expansion is at least ten ppm/°C.

9. The attachment system of claim 5 further including a semiconductor device mounted onto the attachment material and overlying the substrate.

* * * * *